(12) United States Patent
Ikeuchi et al.

(10) Patent No.: US 11,050,381 B2
(45) Date of Patent: Jun. 29, 2021

(54) MOTOR CONTROL DEVICE

(71) Applicant: Panasonic Intellectual Property Management Co., Ltd., Osaka (JP)

(72) Inventors: Yoshiaki Ikeuchi, Nara (JP); Mitsutaka Okura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/321,489

(22) PCT Filed: Jul. 25, 2017

(86) PCT No.: PCT/JP2017/026747
§ 371 (c)(1),
(2) Date: Jan. 29, 2019

(87) PCT Pub. No.: WO2018/051641
PCT Pub. Date: Mar. 22, 2018

(65) Prior Publication Data
US 2020/0014324 A1    Jan. 9, 2020

(30) Foreign Application Priority Data
Sep. 14, 2016   (JP) .............................. JP2016-179940

(51) Int. Cl.
*H02P 29/00* (2016.01)
*H02P 1/02* (2006.01)
(Continued)

(52) U.S. Cl.
CPC .............. *H02P 29/00* (2013.01); *H02P 1/029* (2013.01); *H04L 12/40169* (2013.01); *G01R 31/50* (2020.01)

(58) Field of Classification Search
CPC .............. H04L 12/40169; H02P 1/029; H02P 29/0241; H02P 29/00; G01R 31/50; G05B 29/0241
See application file for complete search history.

(56) References Cited

U.S. PATENT DOCUMENTS 6,119,610 A * 9/2000 Nishizawa ............. D05B 19/14
112/220
2003/0065855 A1   4/2003 Webster
(Continued)

FOREIGN PATENT DOCUMENTS

JP       8-023692       1/1996
JP       2003-102195    4/2003
(Continued)

OTHER PUBLICATIONS

International Search Report of PCT application No. PCT/JP2017/026747 dated Oct. 10, 2017.
(Continued)

*Primary Examiner* — Bickey Dhakal
(74) *Attorney, Agent, or Firm* — McDermott Will & Emery LLP

(57) ABSTRACT

A motor control device includes: a first communication unit that transmits or receives data to or from a motor; a communication disconnection determination unit that determines that the motor and the motor control device are in a disconnection state based on a fact that there is no reply from the motor within a prescribed period, and that determines that the motor and the motor control device have been restored to a connection state based on a fact that a reply from the motor to the motor control device has been restarted; and a replacement determination unit that obtains identification information from an identification information storage of the motor via the first communication unit and determines that the motor has been replaced, when it is
(Continued)

determined that the motor and the motor control device have been restored to the connection state.

4 Claims, 3 Drawing Sheets

(51) Int. Cl.
  *H04L 12/40* (2006.01)
  *G01R 31/50* (2020.01)

(56) References Cited

U.S. PATENT DOCUMENTS

| | | | |
|---|---|---|---|
| 2012/0128113 | A1 | 5/2012 | Park et al. |
| 2013/0193894 | A1* | 8/2013 | Kiguchi .................. H02P 3/00 318/490 |
| 2015/0292917 | A1 | 10/2015 | Omura et al. |
| 2017/0261973 | A1* | 9/2017 | Yamawaki ......... G05B 23/0289 |
| 2018/0156225 | A1* | 6/2018 | Izumi .................... H02P 31/00 |

FOREIGN PATENT DOCUMENTS

| | | |
|---|---|---|
| JP | 3905441 B | 4/2007 |
| JP | 2011-199915 | 10/2011 |
| JP | 2015-154636 | 8/2015 |
| WO | 1999/043882 | 9/1999 |
| WO | 2014/109054 | 7/2014 |

OTHER PUBLICATIONS

The Extended European Search Report dated Jun. 12, 2019 for the related European Patent Application No. 17850547.5.

\* cited by examiner

MOTOR CONTROL DEVICE

TECHNICAL FIELD

The present invention relates to a motor control device that is used in an industrial device such as an industrial robot or a machine tool and that detects that a motor has been replaced.

BACKGROUND ART

Conventionally, this type of motor control device compares the content of identification information included in a motor that is connected when a power source is turned on with a value before the power source is turned on. The identification information enables an individual motor to be specified. Thus, the motor control device detects that the motor has been replaced (see, for example, PTL 1).

FIG. 3 is a block diagram illustrating motor 35 and motor control device 36 in a conventional technique described in PTL 1. As illustrated in FIG. 3, motor 35 includes communication unit A 31 and identification information storage 32. Motor control device 36 is connected to motor 35, and includes communication unit A 34 that transmits or receives data, and replacement determination unit 33 that obtains identification information from identification information storage 32 of motor 35 and determines that motor 35 has been replaced.

However, in a conventional configuration, a timing at which the motor has been replaced fails to be detected. Therefore, the power source of the motor control device needs to be turned on again. When all processes of initialization processing to be performed on the motor control device when the power source is turned on are performed, it is determined whether a motor has been replaced. Therefore, processes that are unnecessary to determine replacement are performed, and there is a problem that it takes time for start-up before a normal motor control state.

CITATION LIST

Patent Literature

PTL 1: Japanese Patent Publication No. 3905441

SUMMARY OF THE INVENTION

It is an object of the present invention to solve a conventional problem. According to the present invention, a timing at which a motor has been replaced is detected in a state in which a power source is turned on. This enables necessary minimum initialization processing after the replacement of a motor.

In order to solve the conventional problem, a motor control device according to the present invention includes: a first communication unit that transmits or receives data to or from a motor; a communication disconnection determination unit that determines that the motor and the motor control device are in a disconnection state based on a fact that there is no reply from the motor within a prescribed period, and that determines that the motor and the motor control device have been restored to a connection state based on a fact that a reply from the motor to the motor control device has been restarted; and a replacement determination unit that obtains identification information from an identification information storage of the motor via the first communication unit and determines that the motor has been replaced, when it is determined that the motor and the motor control device have been restored to the connection state. The replacement determination unit obtains the identification information based on motor connection state information transferred from the communication disconnection determination unit.

The motor control device according to the present invention can reduce a start-up time before a normal motor operation state.

DESCRIPTION OF EMBODIMENTS

Exemplary embodiments of the present invention will be described below with reference to the drawings. The present invention is not limited to the exemplary embodiments.

(First Exemplary Embodiment)

Figure 1:
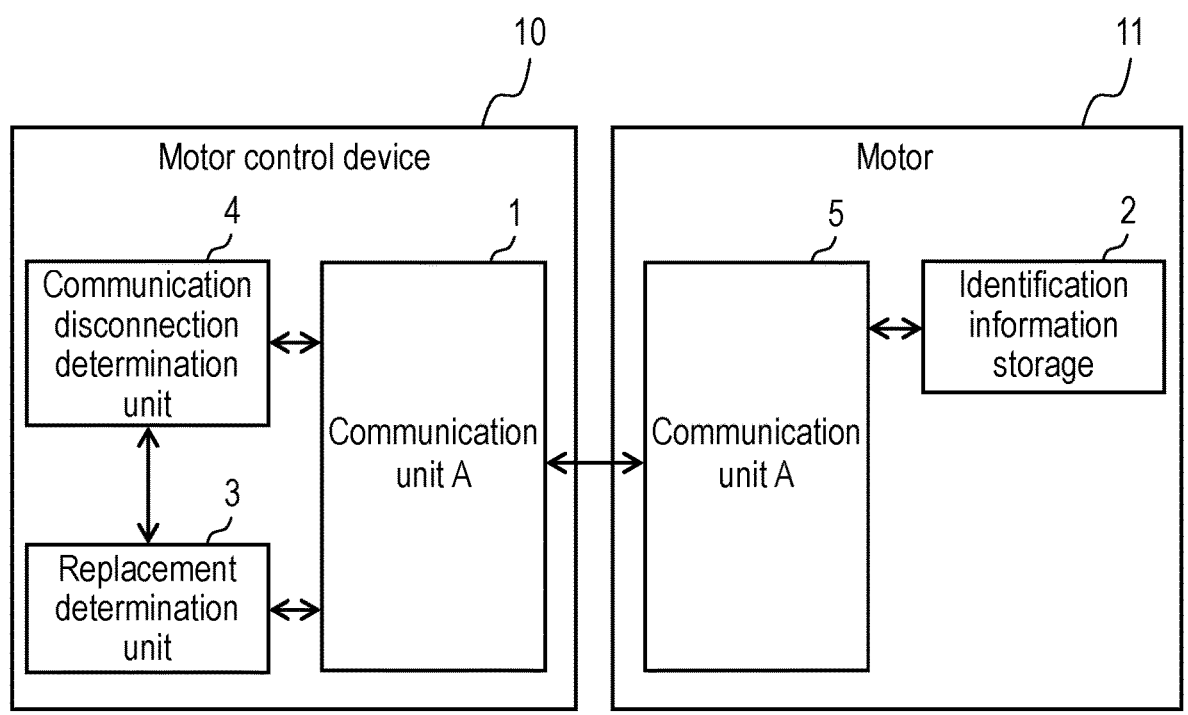
FIG. 1 is a block diagram illustrating a motor control device according to a first exemplary embodiment of the present invention.

FIG. 1 is a block diagram illustrating motor control device 10 according to a first exemplary embodiment of the present invention.

In FIG. 1, motor control device 10 includes communication unit A 1, replacement determination unit 3, and communication disconnection determination unit 4. Motor 11 includes communication unit A 5 and identification information storage 2.

Communication unit A 1 is connected to motor 11 so as to transmit or receive data.

Communication disconnection determination unit 4 determines a connection state of motor 11 via communication unit A 1. Communication disconnection determination unit 4 is organically associated with replacement determination unit 3.

Communication disconnection determination unit 4 determines that motor 11 and motor control device 10 are in a disconnection state based on a fact that there is no reply to data transmission from motor 11 within a prescribed period. Communication disconnection determination unit 4 determines that motor 11 and motor control device 10 have been restored to a connection state based on a fact that a reply to data transmission from motor 11 is restarted.

When the connection state is determined, replacement determination unit 3 obtains identification information from identification information storage 2 of motor 11 via communication unit A 1. Thus, replacement determination unit 3 determines that motor 11 has been replaced. At this time, replacement determination unit 3 obtains the identification information based on motor connection information transferred from communication disconnection determination unit 4.

(Configuration According to First Exemplary Embodiment)

An operation and a working of motor control device 10 configured as described above are described below.

First, motor control device 10 performs initial setting for operating communication unit A 1 and initial setting of replacement determination unit 3 and communication disconnection determination unit 4 when a power source is turned on. Motor control device 10 reads identification information from identification information storage 2 of motor 11 via communication unit A 1. Motor control device 10 initializes a control parameter in accordance with characteristic information unique to motor 11. The read identification information is transferred to replacement determination unit 3.

After initialization has been completed, motor control device 10 enters into a normal motor operation state, and periodically performs data exchange via communication unit A 1. Data to be periodically exchanged is, for example, position information, abnormality detection information, or the like, which is detected in motor 11.

Next, an operation in a case in which motor 11 is removed from motor control device 10 in order to replace a motor in the normal motor operation state is described. By removing motor 11, a reply from motor 11 that has been periodically made via communication unit A 1 is stopped. Communication disconnection determination unit 4 detects that motor 11 has been removed based on a fact that a reply from motor 11 via communication unit A 1 has been stopped during a prescribed period.

Motor control device 10 periodically performs data exchange via communication unit A 1 even after motor 11 has been removed. When there is no reply from motor 11, communication disconnection determination unit 4 determines that motor 11 remains removed. When a reply from motor 11 is restarted, communication disconnection determination unit 4 determines that motor 11 has been restored to the connection state.

Communication disconnection determination unit 4 transfers motor connection state information to replacement determination unit 3. Replacement determination unit 3 confirms the content of the motor connection state information. When replacement determination unit 3 determines that motor 11 has been connected again, replacement determination unit 3 obtains identification information from identification information storage 2 of motor 11, and compares the identification information with identification information obtained at a previous time. When a comparison result indicates that these pieces of identification information are different from each other, replacement determination unit 3 determines that motor 11 has been replaced. When replacement determination unit 3 detects the replacement of the motor, motor control device 10 initializes the control parameter in accordance with characteristic information unique to the motor.

As described above, motor control device 10 according to the present exemplary embodiment includes a first communication unit that corresponds to communication unit A 1 that transmits or receives data to or from motor 11, communication disconnection determination unit 4 that determines that motor 11 and motor control device 10 are in the disconnection state based on a fact that there is no reply from motor 11 within a prescribed period, and that determines that motor 11 and motor control device 10 have been restored to the connection state based on a fact that a reply from motor 11 to motor control device 10 has been restarted, and replacement determination unit 3 that obtains identification information from identification information storage 2 of motor 11 via the first communication unit that corresponds to communication unit A 1, and determines that motor 11 has been replaced, when it is determined that motor 11 and motor control device 10 have been restored to the connection state. Replacement determination unit 3 obtains the identification information based on the motor connection state information transferred from communication disconnection determination unit 4.

This enables motor control device 10 to perform necessary minimum initialization processing after the replacement of the motor. Accordingly, a start-up time before the normal motor operation state can be reduced.

(Second Exemplary Embodiment)

Figure 2:
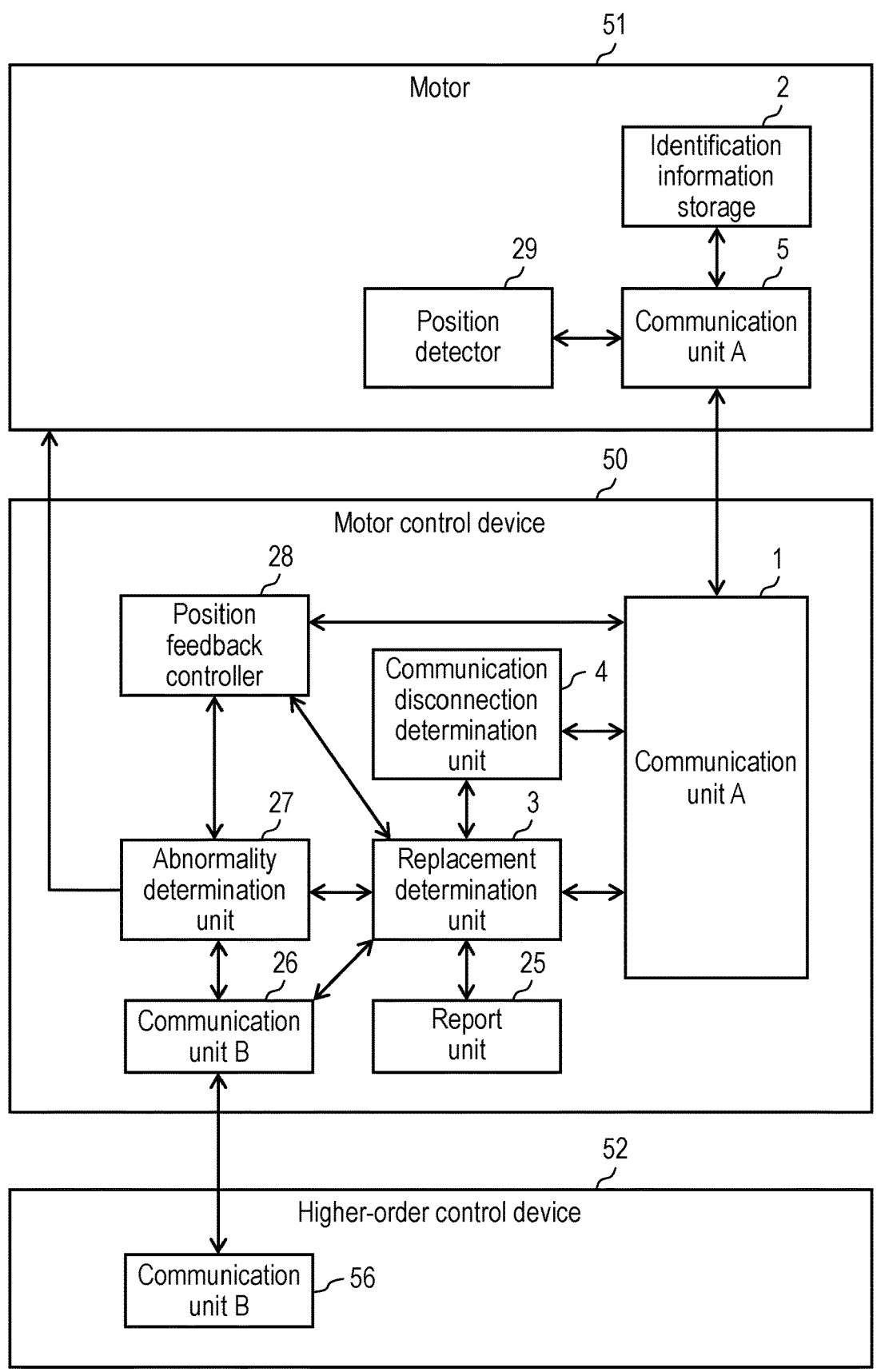
FIG. 2 is a block diagram illustrating a motor control device according to a second exemplary embodiment of the present invention.
Figure 3:
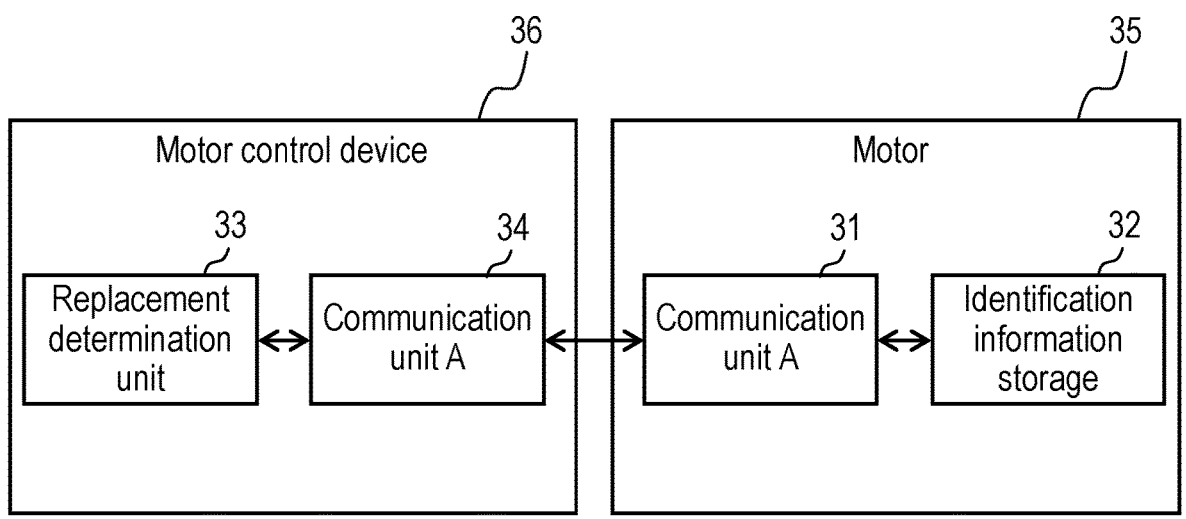
FIG. 3 is a block diagram illustrating a motor and a motor control device in a conventional technique described in PTL 1.

FIG. 2 is a block diagram illustrating motor control device 50 according to a second exemplary embodiment of the present invention.

In the first exemplary embodiment, a motor control device includes communication unit A 1, replacement determination unit 3, and communication disconnection determination unit 4. In the present exemplary embodiment, a motor control device further includes report unit 25, communication unit B 26, abnormality determination unit 27, and position feedback controller 28.

In FIG. 2, report unit 25 outputs motor replacement information obtained from replacement determination unit 3 to an outside of motor control device 50. Report unit 25 is organically associated with replacement determination unit 3.

Communication unit B 26 is connected to communication unit B 56 of higher-order control device 52 so as to transmit or receive data. Motor control device 50 outputs the motor replacement information obtained from replacement determination unit 3 to communication unit B 56 of higher-order control device 52 via communication unit B 26.

When communication disconnection determination unit 4 determines that motor 51 and motor control device 50 are in a disconnection state, abnormality determination unit 27 interrupts power supply to motor 51, and determines that motor 51 is in an abnormal state. Abnormality determination unit 27 is organically associated with replacement determination unit 3 and communication unit B 26.

Position feedback controller 28 controls an output from communication unit A 1 to motor 51 in accordance with position information that has been obtained from motor 51 including position detector 29 via communication unit A 1. Position feedback controller 28 is organically associated with communication unit A 1, replacement determination unit 3, and abnormality determination unit 27.

(Configuration according to second exemplary embodiment)

An operation and a working of motor control device 50 configured as described above are described below.

First, motor control device 50 performs initial setting for operating communication unit A 1 and initial setting of replacement determination unit 3 and communication disconnection determination unit 4 when a power source is turned on. Motor control device 50 reads identification information from identification information storage 2 of motor 51 via communication unit A 1. Motor control device 50 initializes a control parameter in accordance with characteristic information unique to motor 51. The read identification information is transferred to replacement determination unit 3.

After initialization has been completed, motor control device 50 enters into a normal motor operation state, and periodically performs data exchange via communication unit A 1. Data to be periodically exchanged is, for example, position information, abnormality detection information, or the like that is detected in motor 51.

Next, an operation in a case in which motor 51 is removed from motor control device 50 in order to replace a motor in the normal motor operation state is described. By removing motor 51, a reply from motor 51 that has been periodically made via communication unit A 1 is stopped. Communication disconnection determination unit 4 detects that motor 51 has been removed based on a fact that a reply from motor 51 via communication unit A 1 has been stopped during a prescribed period.

Motor control device 50 periodically performs data exchange via communication unit A 1 even after motor 51 has been removed. When there is no reply from motor 51, communication disconnection determination unit 4 determines that motor 51 remains removed. When a reply from motor 51 is restarted, communication disconnection determination unit 4 determines that motor 51 has been restored to a connection state.

Communication disconnection determination unit 4 transfers motor connection state information to replacement determination unit 3. Replacement determination unit 3 confirms the content of the motor connection state information. Replacement determination unit 3 generates motor replacement information, and transfers the motor replacement information to report unit 25, communication unit B 26, abnormality determination unit 27, and position feedback controller 28.

Report unit 25 is, for example, a 7-segment light-emitting diode (LED). According to the motor replacement information obtained from replacement determination unit 3, it can be determined, for example, that a motor has not been replaced after the turn-on of the power source when report unit 25 displays 0 and that the motor has been replaced once when report unit 25 displays 1.

When the motor replacement information obtained from replacement determination unit 3 indicates that motor 51 is in a not-yet-connection state, abnormality determination unit 27 determines that motor 51 is an abnormal state. Abnormality determination unit 27 interrupts an output of position feedback controller 28 to motor 51, and transfers, to communication unit B 26, information indicating that motor 51 is in the abnormal state.

Communication unit B 26 transfers, to higher-order control device 52, the motor replacement information obtained from replacement determination unit 3 and the abnormal state obtained from abnormality determination unit 27.

When a motor replacement task has been completed, higher-order control device 52 transfers an abnormal state releasing command to abnormality determination unit 27 of motor control device 50 via communication unit B 26.

When communication disconnection determination unit 4 determines that motor 51 has been connected again, communication disconnection determination unit 4 obtains identification information from identification information storage 2 of motor 51, and compares the identification information with identification information obtained at a previous time. When a comparison result indicates that these pieces of identification information are different from each other, communication disconnection determination unit 4 determines that motor 51 has been replaced. When the replacement of the motor is detected, motor control device 50 initializes the control parameter in accordance with characteristic information unique to the motor.

When abnormality determination unit 27 confirms that motor 51 has been correctly replaced and that initialization of the control parameter has been completed based on the motor replacement information obtained from replacement determination unit 3, and receives the abnormal state releasing command from higher-order control device 52, abnormality determination unit 27 initializes internal position information of position feedback controller 28. To initialize the internal position information means to reset position coordinates of a motor that are included in the internal position information based on a position of a motor after replacement. Abnormality determination unit 27 releases the abnormal state after initialization has been completed, and reports abnormal state releasing to higher-order control device 52 via communication unit B 26. Abnormality determination unit 27 enables the output of position feedback controller 28 to motor 51.

As described above, motor control device 50 according to the present exemplary embodiment includes report unit 25 that outputs the motor replacement information obtained from replacement determination unit 3 to an outside of motor control device 50. By doing this, an operator who is not directly performing a replacement task can also recognize whether a motor has been replaced. In addition, the operator can start operation after changing operation conditions according to a minute change in motor operation due to replacement. Accordingly, a production loss (a yield) can be reduced.

In addition, motor control device 50 includes a second communication unit that corresponds to communication unit B 26 that transmits or receives data to or from higher-order control device 52. Motor control device 50 outputs the motor replacement information obtained from replacement determination unit 3 to higher-order control device 52 via the second communication unit that corresponds to communication unit B 26. By doing this, the operator can directly recognize whether a motor has been replaced, by using higher-order control device 52. In addition, the operator can start operation after changing operation conditions according to a minute change in motor operation due to replacement. Accordingly, a production loss (a yield) can be reduced, and production man-hours can also be reduced due to automation.

Motor control device 50 also includes abnormality determination unit 27 that interrupts power supply to motor 51 and determines that motor 51 is in the abnormal state, when communication disconnection determination unit 4 determines that motor 51 and motor control device 50 are in the disconnection state. Abnormality determination unit 27 determines based on the motor replacement information obtained via replacement determination unit 3 whether the abnormal state will be cleared in accordance with an abnormal state releasing command that has been obtained from higher-order control device 52 via the second communication unit that corresponds to communication unit B 26. This enables an erroneous motor replacement task to be detected, and the operator can restart operation in a safe state.

Motor control device 50 further includes position feedback controller 28 that controls an output to motor 51 based on position information that has been obtained from motor 51 including position detector 29 via the first communication unit that corresponds to communication unit A 1. Motor control device 50 initializes the position information in position feedback controller 28 based on the motor replacement information obtained from replacement determination unit 3. This enables position feedback control based on position information of a motor after replacement. Accordingly, operation can be restarted in a safe state without misalignment. In addition, a processing load on higher-order control device 52 can be reduced.

INDUSTRIAL APPLICABILITY

As described above, a motor control device according to the present invention enables necessary minimum initialization processing after the replacement of a motor. In addition, a start-up time before a normal motor operation state can be reduced. Accordingly, the motor control device according to the present invention is also applicable to usage such as the replacement of a welding head incorporating a motor of a welding robot according to a welding portion.

REFERENCE MARKS IN THE DRAWINGS 1, 5: communication unit A
2: identification information storage
3: replacement determination unit
4: communication disconnection determination unit
10, 50: motor control device
11, 51: motor
25: report unit
26, 56: communication unit B
27: abnormality determination unit
28: position feedback controller
29: position detector
52: higher-order control device

The invention claimed is:
1. A motor control device, wherein the motor control device is programmed to:
   transmit or receive data to or from a motor;
   determine that the motor and the motor control device are in a disconnection state when there is no reply from the motor within a prescribed period, and that determine that the motor and the motor control device have been restored to a connection state when a reply is received from the motor to the motor control device;
   obtain identification information from an identification information storage of the motor and determine that the motor has been replaced, when it is determined that the motor and the motor control device have been restored to the connection state,
   wherein the motor control device is further programmed to obtain the identification information based on motor connection state information; and
   interrupt power supply to the motor and determine an abnormal state, when it is determined that the motor and the motor control device are in the disconnection state,
   wherein the motor control device is further programmed to, based on the motor replacement information, whether the abnormal state is released in accordance with an abnormal state releasing command obtained from a higher-order control device.

2. The motor control device according to claim 1, further comprising a display device that displays, to an outside of the motor control device, motor replacement information.

3. The motor control device according to claim 1, wherein the motor control device is further programmed to transmit or receive data to or from the higher-order control device,
   wherein the motor control device outputs motor replacement information, to the higher-order control device.

4. The motor control device according to claim 1, wherein the motor control device is further programmed to control an output to the motor based on position information obtained from the motor including a position detector,
   wherein the motor control device initializes the position information in the position feedback controller based on motor replacement information.

* * * * *